US012812941B2

(12) United States Patent
Friesen et al.

(10) Patent No.: US 12,812,941 B2
(45) Date of Patent: Nov. 24, 2026

(54) SILICON-GERMANIUM HETEROSTRUCTURES WITH SHEAR STRAIN AND GERMANIUM CONCENTRATION OSCILLATIONS FOR ENHANCED VALLEY SPLITTING

(71) Applicant: Wisconsin Alumni Research Foundation, Madison, WI (US)

(72) Inventors: Mark G. Friesen, Middleton, WI (US); Benjamin Woods, Middleton, WI (US); Mark A. Eriksson, Madison, WI (US); Robert J. Joynt, Madison, WI (US); Emily S. Joseph, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 626 days.

(21) Appl. No.: 18/364,148

(22) Filed: Aug. 2, 2023

(65) Prior Publication Data

US 2025/0254951 A1 Aug. 7, 2025

(51) Int. Cl.

| | |
|---|---|
| ***H10D 62/81*** | (2025.01) |
| ***B82Y 10/00*** | (2011.01) |
| ***H10D 62/822*** | (2025.01) |
| ***H10D 62/832*** | (2025.01) |
| ***H10D 62/834*** | (2025.01) |

(52) U.S. Cl.

CPC ............ *H10D 62/814* (2025.01); *B82Y 10/00* (2013.01); *H10D 62/822* (2025.01); *H10D 62/832* (2025.01); *H10D 62/834* (2025.01)

(58) Field of Classification Search

CPC .. H10D 62/814; H10D 62/822; H10D 62/832; H10D 62/834; H10D 62/121; H10D 62/8164; H10D 48/383; H10D 62/812–8181; H10D 30/791–798;

(Continued)

(56) References Cited

U.S. PATENT DOCUMENTS

| | | | |
|---|---|---|---|
| 6,597,010 | B2 | 7/2003 | Eriksson et al. |
| 9,941,430 | B2 | 4/2018 | Andreev et al. |

(Continued)

FOREIGN PATENT DOCUMENTS

| | | |
|---|---|---|
| WO | 2023277690 A1 | 1/2023 |

OTHER PUBLICATIONS

Boykin, T. B., Klimeck, G., Eriksson, M. A., Friesen, M., Coppersmith, S. N., Von Allmen, P., . . . & Lee, S. (2004). Valley splitting in strained silicon quantum wells. *Applied Physics Letters*, 84(1), 115-117.

(Continued)

*Primary Examiner* — Shahed Ahmed

(74) *Attorney, Agent, or Firm* — Bell & Manning, LLC

(57) ABSTRACT

Heterostructures having germanium-seeded, shear-strained silicon quantum wells are provided. Also provided are gate-controlled qubits based on the heterostructures, and quantum computing systems based on the qubits. The heterostructures include a quantum well of germanium-seeded silicon positioned between two quantum barriers of germanium or a silicon-germanium alloy. The silicon of the quantum well is under a shear strain and is seeded with germanium such that the germanium concentration in the quantum well has an oscillating profile.

20 Claims, 5 Drawing Sheets
(3 of 5 Drawing Sheet(s) Filed in Color)

(58) Field of Classification Search
CPC .......... B82Y 10/00; H10H 20/811–812; G01L 1/00–26
See application file for complete search history.

(56) References Cited

U.S. PATENT DOCUMENTS

| | | | | |
|---|---|---|---|---|
| 10,572,814 | B2 | 2/2020 | Friesen et al. | |
| 11,133,388 | B1 * | 9/2021 | Joynt | H10D 62/822 |
| 2002/0179897 | A1 | 12/2002 | Eriksson et al. | |
| 2005/0184285 | A1 * | 8/2005 | Friesen | H10D 48/385 257/14 |
| 2009/0101887 | A1 | 4/2009 | Dahlstrom | |
| 2009/0173934 | A1 | 7/2009 | Jain | |
| 2011/0147711 | A1 * | 6/2011 | Pillarisetty | H10D 62/116 257/14 |
| 2014/0197376 | A1 | 7/2014 | Ma et al. | |
| 2017/0012116 | A1 | 1/2017 | Pillarisetty et al. | |
| 2019/0044045 | A1 | 2/2019 | Thomas | |
| 2019/0334020 | A1 | 10/2019 | Amin | |
| 2020/0067267 | A1 * | 2/2020 | Takayama | H01S 5/0233 |
| 2020/0203593 | A1 | 6/2020 | Roberts et al. | |
| 2020/0227523 | A1 | 7/2020 | Leipold et al. | |
| 2023/0085706 | A1 | 3/2023 | Friesen et al. | |

OTHER PUBLICATIONS

Boykin, T. B., Klimeck, G., Friesen, M., Coppersmith, S. N., von Allmen, P., Oyafuso, F., & Lee, S. (2004). Valley splitting in low-density quantum-confined heterostructures studied using tight-binding models. *Physical Review B*, 70(16), 165325.

Buterakos, D., & Sarma, S. D. (2021). Spin-Valley Qubit Dynamics in Exchange-Coupled Silicon Quantum Dots. *PRX Quantum*, 2(4), 040358.

Feng. Y., & Joynt, R. (2022). Enhanced valley splitting in Si layers with oscillatory Ge concentration. *Physical Review B*, 106(8), 085304.

Friesen, Mark, et al. "Practical design and simulation of silicon-based quantum-dot qubits." Physical Review B 67.12 (2003): 121301.ID.

Friesen, M., Chutia, S., Tahan, C., & Coppersmith, S. N. (2007). Valley splitting theory of Si Ge/ Si/ Si Ge quantum wells. *Physical Review B*, 75(11), 115318.

Hollmann et al., "Large, tunable valley splitting and single-spin relaxation mechanisms in a Si/SixGe1-x quantum dot," arXiv:1907.04146v2, Mar. 30, 2020.

Meghan Steele Horan, "Physicists device new approach to manipulate silicon 'quibits'" Phys.org, https://phys.org/news/2017-07-physicists-approach-silicon-qubits,html, Jul. 7, 2017.

Jiang, Zhengping, et al. "Effects of interface disorder on valley splitting in SiGe/Si/SiGe quantum wells." Applied Physics Letters 100.10 (2012): 103502.

Kharche, Neerav, et al. "Valley splitting in strained silicon quantum wells modeled with 2 miscuts, step disorder, and alloy disorder." Applied Physics Letters 90.9 (2007): 092109.

Lawrie et al., Quantum dot arrays in silicon and germanium, Appl. Phys. Lett. 116, 080501, 2020, pp. 1-9.

Losert, M. P., Eriksson, M. A., Joynt, R., Rahman, R., Scappucci, G., Coppersmith, S. N., & Friesen, M. (2023). Practical strategies for enhancing the valley splitting in Si/SiGe quantum wells. *Physical Review B*, 108(12), 125405.

McGuire et al., "Valley splitting in a Si/SiGe quantum point contact," New J. Phys,. 12, 033039, 2010.

McJunkin, T., Harpt, B., Feng, Y., Losert, M. P., Rahman, R., Dodson, J. P., . . . & Eriksson, M. A. (2022). SiGe quantum wells with oscillating Ge concentrations for quantum dot qubits. *Nature Communications*, 13(1), 7777.

McJunkin, T., MacQuarrie, E. R., Tom, L., Neyens, S. F., Dodson, J. P., Thorgrimsson, B., . . . & Eriksson, M. A. (2021). Valley splittings in Si/SiGe quantum dots with a germanium spike in the silicon well. *Physical Review B*, 104(8), 085406.

Neyens et al., "Measurements of capacitive coupling within a quadruple quantum dot array," arXiv:907.08216v1, Jul. 18, 2019.

P210410WO01 International Search Report and Written Opinion for International application No. PCT/US2022/033927, mailed Mar. 16, 2023, pp. 1-9.

Paquelet Wuetz, B., Losert, M. P., Koelling, S., Stehouwer, L. E., Zwerver, A. M. J., Philips, S. G., . . . & Scappucci, G. (2022). Atomic fluctuations lifting the energy degeneracy in Si/SiGe quantum dots. *Nature Communications*, 13(1), 7730.

Srinivasen et al., "Valley splitting in Si quantum dots embedded in SiGe," Applied Physics letters, arXiv:0808.1234v1, Aug. 8, 2008.

Sverdlov, Viktor, and Siegfried Selberherr. "Electron subband structure and controlled valley splitting in silicon thin-body SOI FETs: two-band k· p theory and beyond." *Solid-State Electronics* 52.12 (2008): 1861-1866.

Vandersypen, Lieven MK, and Mark A. Eriksson. "Quantum computing with semiconductor spins." *Physics Today* 72.8 (2019): 38-45.

Wang, G., Song, Z. G., Luo, J. W., & Li, S. S. (2022). Origin of giant valley splitting in silicon quantum wells induced by superlattice barriers. *Physical Review B*, 105(16), 165308.

Watson et al., "A programmable two-qubit quantum processor in silicon," arXiv:1708.04214v2, May 31, 2018.

Woods, B. D., Eriksson, M. A., Joynt, R., & Friesen, M. (2023). Spin-orbit enhancement in Si/SiGe heterostructures with oscillating Ge concentration. *Physical Review B*, 107(3), 035418.

Yang et al., "Spin-valley Lifetimes in a Silicon Quantum Dot with Tunable Valley Splitting," Nature Communications, 4:2069, 8 pages, 2013.

Zhang et al., "Genetic design of enhanced valley splitting towards a spin qubit in silicon," Nature Communications, 4:2396, 7 pages, 2013.

International Search Report and Written Opinion in International Patent Application No. PCT/US2024/028472 dated Jun. 4, 2025, 9 pages.

Extended European Search Report in EP Patent Application No. 24877717.9 dated Jun. 9, 2026, 11 pages.

Corley-Wiciak, et al., "Nanoscale Mapping of the 3D Strain Tensor in a Germanium Quantum Well Hosting a Functional Spin Qubit Device," ACS Applied Materials & Interfaces, 2023, pp. 3119-3130, vol. 15, https://doi.org/10.1021 /acsami.2cl 7395.

Piot, et al. "A single hole spin with enhanced coherence in natural silicon," arxiv.org Cornell University Library, 201 Olin Library Cornell University Ithaca, NY 14853, Jan. 21, 2022, 21 pages, XP091135649.

* cited by examiner

SILICON-GERMANIUM HETEROSTRUCTURES WITH SHEAR STRAIN AND GERMANIUM CONCENTRATION OSCILLATIONS FOR ENHANCED VALLEY SPLITTING

REFERENCE TO GOVERNMENT RIGHTS

This invention was made with government support under W911NF-17-1-0274 and W911NF-22-1-0090 awarded by the ARMY/ARO. The government has certain rights in the invention.

BACKGROUND

Quantum dot qubits in Si/SiGe quantum wells are an attractive platform for quantum computation due to their long coherence times, fast gate operations, nuclear-spin free isotopes, and compatibility with the microelectronics industry.

Useful quantum hardware will require vast arrays of reliable, low-error qubits. A key obstacle in realizing this with silicon (Si) quantum dots is the presence of two degenerate valleys near the Z point of the bulk band structure of Si. (F. A. Zwanenburg, et al., Rev. Mod. Phys. 85, 961 (2013); M. Cardona et al., Phys. Rev. 142, 530 (1966).) This leads to a small energy spacing between ground and excited valley states, called valley splitting, which causes decoherence in qubits if not sufficiently large. (Zwanenburg, et al., 2013; D. Buterakos et al., PRX Quantum 2, 040358 (2021).) The most popular strategies for realizing large valley splittings involve engineering atomically sharp interfaces in either thin quantum wells or in the presence of a large electric field, where the small length scale features of the interface can directly couple the valleys that are separated by a large distance in the Brillouin zone. (T. B. Boykin, et al., Applied Physics Letters 84, 115 (2004): T. B. Boykin, et al., Phys. Rev. B 70, 165325 (2004); M. Friesen, et al., Phys. Rev. B 75, 115318 (2007).) Unfortunately, interface imperfections lead to valley splittings that vary from quantum dot to quantum dot and device to device, with typical values ranging from ~10 μeV to 300 μeV.

Recently, strategies to realize large valley splittings that do not rely upon the presence of a sharp interface have been studied, including alloy disorder and germanium (Ge) concentration modulations. There are two Ge modulation systems which have been named the long-wavelength and short-wavelength wiggle wells. In them, a small amount of Ge is included within a Si quantum well region. In the long- and short-wavelength wiggle wells, the Ge has concentration oscillations of wavelength λ~1.68 nm and λ~0.32 nm, respectively. (T. McJunkin, et al., Nature Communications 13, 7777 (2022); Y. Feng and R. Joynt, Phys. Rev. B 106, 085304 (2022)) However, the small scale of the Ge modulations in the short-wavelength wiggle well makes it difficult to produce, while the valley splitting for the long-wavelength wiggle well, which lacks shear strain, is limited.

SUMMARY

Semiconductor heterostructures having Ge-seeded, shear-strained silicon quantum wells, gate-controlled qubits based on the heterostructures, and quantum computing systems based on the qubits are provided.

One embodiment of a heterostructure includes: a first quantum barrier comprising a layer of silicon-germanium alloy or a layer of germanium: a second quantum barrier comprising a layer of silicon-germanium alloy or a layer of germanium; and a quantum well comprising a layer of shear-strained germanium-seeded silicon disposed between the first quantum barrier and the second quantum barrier, wherein the layer of germanium-seeded silicon has an oscillating germanium concentration along its thickness direction (z) and a shear strain, $\varepsilon_{xy}$, in a plane normal to the thickness direction.

One embodiment of a gate-controlled quantum dot includes: a heterostructure of a type described herein; and one or more electrostatic gates in electrical communication with the heterostructure, wherein the one or more electrostatic gates are configured to apply a controllable potential to the quantum well that confines electrons in the quantum well in three dimensions.

One embodiment of a quantum computing system for performing quantum computation includes: a heterostructure of a type described herein: one or more electrostatic gates in electrical communication with the heterostructure, the one or more electrostatic gates being configured to apply controllable potentials to the quantum well, wherein the controllable potentials define one or more gate-controlled qubits in the heterostructure: a controller for controlling the potentials applied by the one or more electrostatic gates; and a sensor for reading out a state of the one or more gate-controlled qubits.

Other principal features and advantages of the invention will become apparent to those skilled in the art upon review of the following drawings, the detailed description, and the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Illustrative embodiments of the invention will hereafter be described with reference to the accompanying drawings, wherein like numerals denote like elements.

DETAILED DESCRIPTION

Semiconductor heterostructures having Ge-seeded, shear-strained Si quantum wells are provided. Also provided are gate-controlled qubits based on the heterostructures, and quantum computing systems based on the qubits. The heterostructures include a quantum well of Si positioned between two quantum barriers of Ge or silicon-germanium alloy (SiGe). The Si of the quantum well is under a shear strain and is seeded with Ge such that the Ge concentration in the quantum well has an oscillating profile with a period that enhances valley splitting in this silicon.

Together, the shear strain and the oscillating Ge concentration increase the valley splitting in the conduction band of the quantum well, relative to the valley splitting in the absence of the shear strain and oscillating Ge concentration. The increase in the valley splitting improves the control of qubit states in a qubit incorporating the heterostructure. In addition, the long-period Ge concentration oscillations in the quantum well enhances spin-orbit coupling in electron-spin qubits made from the heterostructures, enabling spin manipulation without the need for micromagnets, greatly improving the scalability of qubit devices. Notably, the quantum well design does not rely on atomically sharp interfaces between the quantum barrier layers and the quantum well layer or within the quantum well layer in order to achieve increased valley splitting.

Figure 1A:
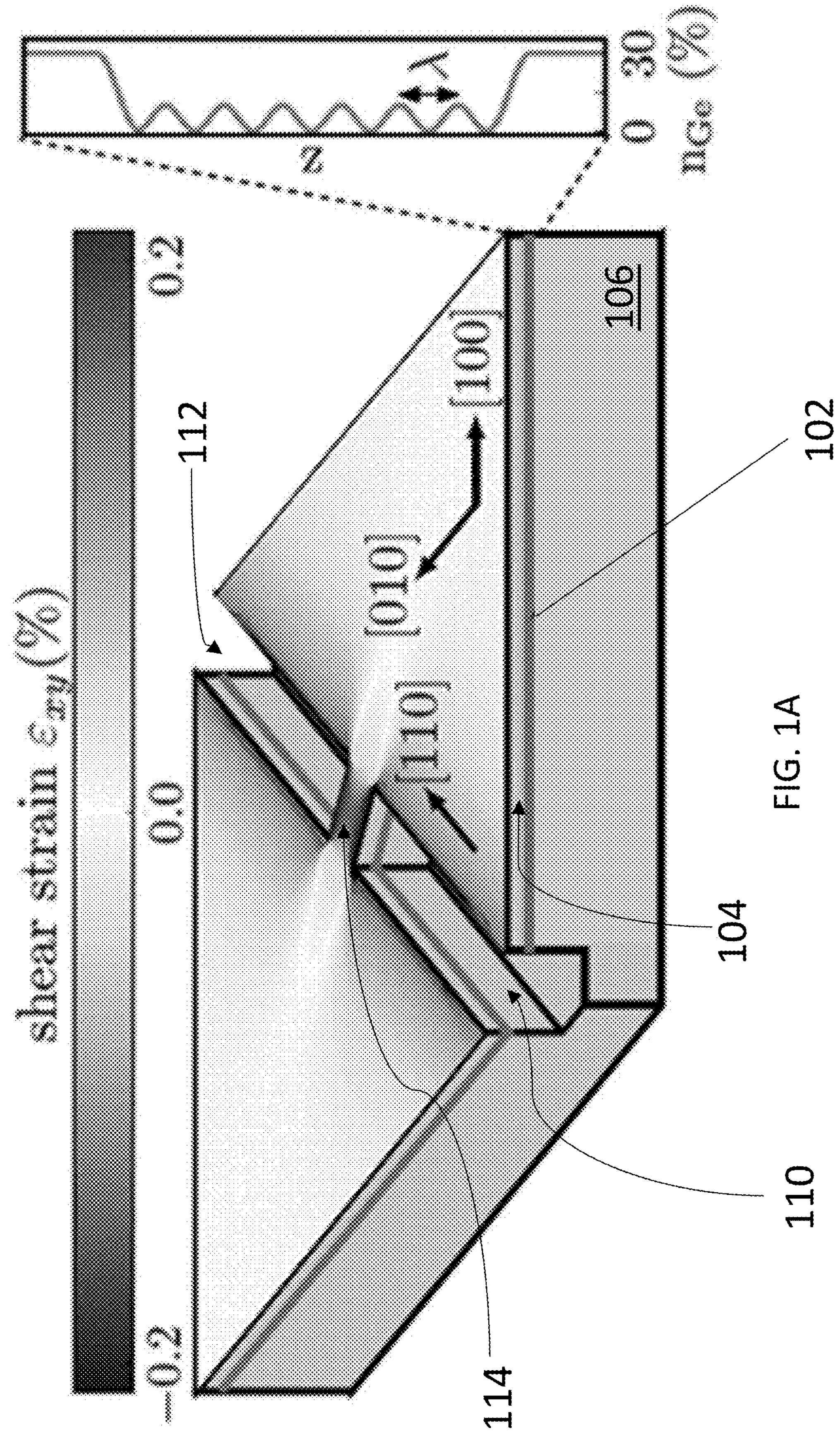
FIG. 1A shows a heterostructure that provides enhanced valley splitting through a combination of Ge concentration oscillations and shear strain, $\varepsilon_{xy}$, in a silicon quantum well. The Ge concentration profile $n_{Ge}$ in the quantum well region (shown in the insert) contains Ge concentration oscillations of wavelength λ. Etched trenches aligned with the [110] crystallographic direction of silicon produce large shear strain $\varepsilon_{xy}$ in a channel region between the trenches, as shown by the shading map taken from a COMSOL calculation with trenches that have a depth and width of 1 μm and are separated by 1 μm. (Alternatively, the tranches could be aligned along the orthogonal [1$\bar{1}$0] crystallographic direction.)

One embodiment of a heterostructure having a shear-strained and Ge-seeded Si quantum well layer 102 with an oscillating Ge concentration between two barrier layers 104, 106 is shown in FIG. 1A. In the heterostructure, Ge-seeded Si quantum well layer 102 is characterized by an oscillating Ge concentration throughout its thickness, where the thickness direction of the Si quantum well layer is the direction normal to the plane of the silicon and corresponds to the z-direction in FIG. 1A. As used herein, the term oscillating Ge concentration refers to a concentration that varies repetitively between maximum and minimum concentrations. The shape of the oscillating profile may take a variety of forms but is characterized by a plurality of peaks alternating with a plurality of troughs. The concentration of Ge in Si quantum well layer 102 may vary continuously and gradually between the peaks and troughs of the concentration profile, as in the case of a sinusoidal germanium concentration profile (insert FIG. 1A) or a germanium concentration having a triangular wave profile. Alternatively, the germanium concentration may change abruptly between a low (e.g., zero) concentration of germanium and a maximum concentration of germanium, as in the case of a germanium concentration profile that forms a series of delta functions or a square wave function, or may take on an oscillating form intermediate between a continuously and gradually varying profile and an abruptly changing profile. It should be noted, however, that the peaks and troughs of the Ge concentration in the Si layer need not have perfectly uniform periods, widths, and/or amplitudes. More particularly, in the case of sinusoidal Ge concentration profile, a perfect sine wave profile is not required. For the purposes of this disclosure, a sinusoidal profile includes true sine wave profiles as well as sine wave-like profiles that have a nominal wavelength and sine wave shape, but that deviate from a prefect sine wave due to experimental limitations. These sine wave-like sinusoidal profiles may be fit by or modeled as sine waves.

The period of the oscillating Ge concentration in the Si quantum well, which corresponds to the wavelengths (λ) for a sinusoidal concentration profile, is desirably sufficiently close to 1.68 nm that the Ge concentration oscillations together with the shear strain in the system produce a silicon z valley splitting, $E_{VS}$, of at least 50 μeV. For heterostructures with applications in quantum computing, it is also advantageous for the oscillating Ge concentration to have a period that provides an enhancement in the spin-orbit coupling of qubits made from the heterostructures. The period of oscillation needed to obtain a desired level of valley splitting will depend on various factors, including the level of shear strain and the Ge concentration in the quantum well, as discussed in more detail below.

Figure 1B:
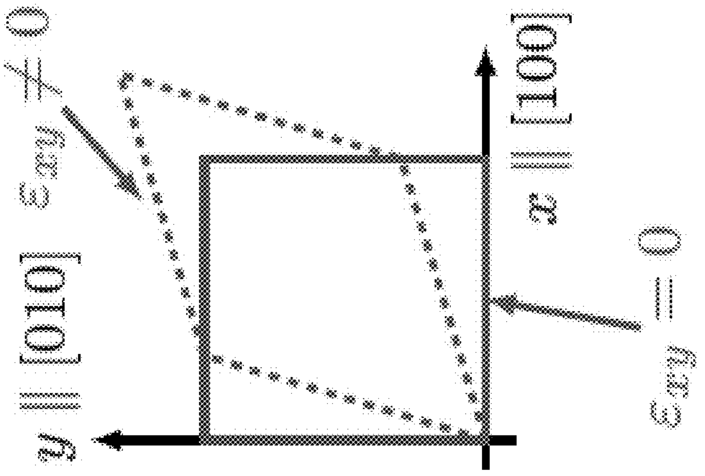
FIG. 1B shows system deformation under shear strain $\varepsilon_{xy}$.

Shear strain in the Ge-seeded Si quantum well refers to an elongation along the [110] crystallographic direction of the Si, which may or may not be accompanied by a compression along the [1$\bar{1}$0] crystallographic direction of the Si (FIG. 1B), or to a compression along the [110] crystallographic direction of the Si and an elongation along the [1$\bar{1}$0] crystallographic direction of the Si. As shown in FIG. 1A, this shear strain is present in the plane of the silicon quantum well layer of the heterostructure, which corresponds to the xy plane of the heterostructure. Therefore, the shear strain is designated $\varepsilon_{xy}$. The shear strain can be created in the Si quantum well using different approaches. In the illustrative example of FIG. 1A, shear strain is created by two trenches 110, 112 aligned along the [110] crystallographic direction of the Si, such that a large localized shear strain $\varepsilon_{xy}$ arises in the channel 114 formed between the trenches. In FIG. 1A, the crystallographic directions of the Si are labelled and the shading map at the top of the figure shows the level of shear strain $\varepsilon_{xy}$ within the Ge-seeded Si quantum well.

Figure 1C:
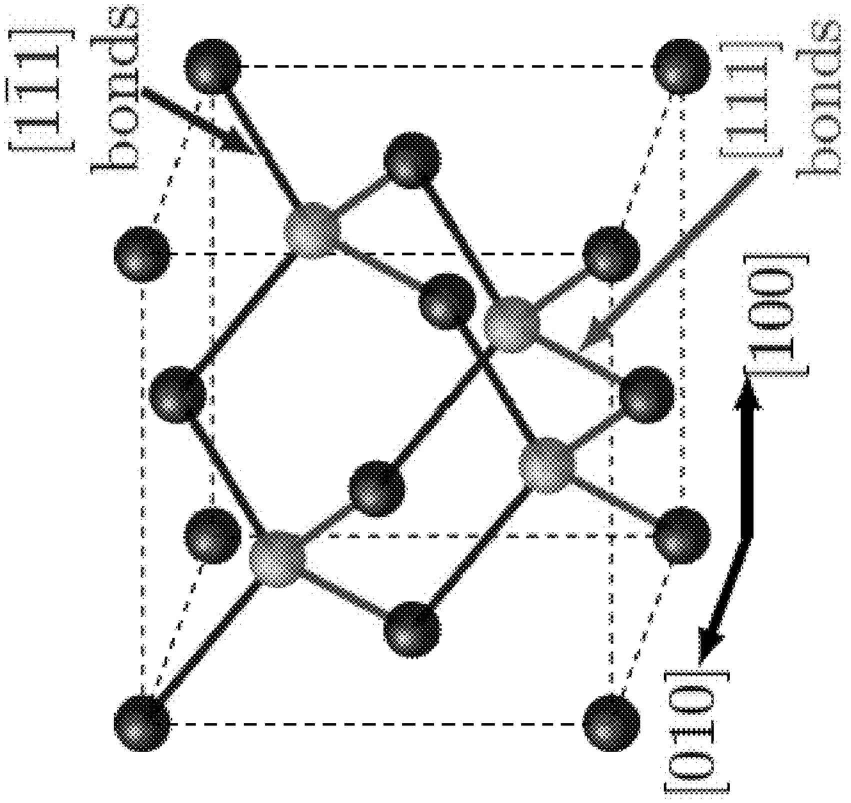
FIG. 1C shows the diamond crystal structure of Si, where black and gray atoms belong to different sublattices. The [111] (grey) and [1$\bar{1}$1] (black) bonds are elongated and shortened, respectively, for $\varepsilon_{xy}>0$.

Without intending to be bound to any theory of the inventions disclosed herein, the mechanism behind the increased valley splitting produced by the Ge-seeded, shear-strained silicon quantum wells may be attributed to a second-order coupling between the two valley minima as follows. First, the periodic potential produced by the Ge concentration oscillations in the Si may couple each valley to satellite regions a distance 2π/λ away in momentum space. Second, the shear strain $\varepsilon_{xy}$ can produce a coupling between the satellite region of a given valley to the opposite valley minimum provided the satellite-valley separation distance is 4π/a in momentum space, where a=0.543 nm is the side length of the conventional unit cell in Si, leading to the condition λ≈1.7 nm. The shear strain produces a 4π/a coupling due to an alternating change of the bond lengths and angles in the Si crystal, where the [111] and [1$\bar{1}$1] bonds shown in FIG. 1C are elongated and compressed, respectively, for $\varepsilon_{xy}$>0. In turn, this alternating change of bond lengths may produce a change in coupling between neighboring atoms containing a $(-1)^m$ factor, where m is the monolayer index. Finally, taking the Fourier transform of the $(-1)^m$ factor produces a coupling between states exactly halfway across momentum space, which corresponds to $\Delta k=4\pi/a$.

The enhanced intrinsic spin-orbit coupling arising from the long wavelength Ge concentration oscillations can be attributed to the wave function satellites of a given valley coupling strongly to the opposite valley through Dresselhaus spin-orbit coupling, whereby the selection rules of the Dresselhaus spin-orbit coupling lead to a spin-orbit coupling enhancement. More details regarding spin-orbit coupling enhancement can be found in Woods, Benjamin D., et al. "Spin-orbit enhancement in Si/SiGe heterostructures with oscillating Ge concentration." *Physical Review B* 107.3 (2023): 035418.

While the embodiment of the heterostructure shown in FIG. 1A uses two open trenches etched into the top side of the heterostructure to form a channel under shear strain, a single channel and/or other mechanisms for creating a shear strain in a Ge-seeded Si quantum well can also be used. For example, instead of using open trenches 110, 112, the trenches can be at least partially filled with a material that imparts a large thermal contraction or expansion while the device is being fabricated, or when the device is cooled to operating temperatures near or below 1 K. In addition, it may be advantageous to fill the trenches to the top of the heterostructure near the channel region, because the filling material would provide more space on the exposed upper surface of the heterostructure for gating electrodes used to create qubits in the heterostructure, as described in greater detail below.

When trenches are used to impart the shear strain on the Ge-seeded Si quantum well, the trenches can be etched into the heterostructure from the top side, as shown in FIG. 1A. However, the trenches can also be etched into the heterostructure from the backside, provided that an etch stop is used to prevent the etching of the quantum barrier and quantum well layers. A backside etch may be advantageous because it preserves more space on the exposed upper surface of the heterostructure for gating electrodes used to create qubits in the heterostructure, as described in greater detail below. In addition, trenches etched from the bottom of the heterostructure make the system much more amenable to shear strain from materials placed on the top of the heterostructure, such as the gating electrodes and silicon nitride stressors.

The creation of a shear strain need not involve trenches. For example, a shear strain can be produced by a physical deformation of the heterostructure, such as bending, twisting, and/or stretching the heterostructure. Such stresses can be produced, for example, by an external mechanical assembly. A shear strain can also be imparted by the patterned growth of materials having a lattice mismatch with the material of the barrier layer on said barrier layer, or by patterned growth of a material with an intrinsic, depositional strain, or with a different thermal contraction coefficient than the barrier layer, which can impart a tensile or compressive strain when the device is cooled to operating temperatures near or below 1 K. Using this approach, materials that induce a tensile strain on the heterostructure can be used to elongate the Ge-seeded silicon quantum well along the [110] or [1$\bar{1}$0] crystallographic direction and materials that induce a compressive strain on the heterostructure can be used to compress the Ge-seeded silicon quantum well along the [1$\bar{1}$1] or [110] crystallographic direction.

A desired degree of valley splitting can be achieved by various combinations of Ge concentration, Ge concentration oscillation period, and shear strain in the Si quantum well. Moreover, while the proposed theory of operation presented above suggests an optimal Ge oscillation period of approximately 1.7 nm in the Si quantum well, the valley splitting and spin-orbit coupling can be achieved over a range of periods centered at or near 1.7 nm. Generally, a higher Ge concentration will provide a higher valley splitting. However, higher Ge concentrations will also provide a less clean environment and may lead to electron scattering. Thus, in practice, the optimal Ge concentration may be based on a trade-off between these considerations. By way of illustration only, in some embodiments of the heterostructures the average concentration of Ge in the Ge-seeded silicon of the quantum well layer, average $n_{Ge}$, is in the range from 0.5 atomic percent (at. %) to 10 at. %, including in the range from 1 at. % to 6 at. %, and further including in the range from 1 at. % to 4 at. %. In some embodiments of the heterostructures, the period of the Ge oscillations in the Si quantum well is in the range from 1.2 nm to 2.5 nm, including periods in the range from 1.4 nm to 2.3 nm, and further including periods in the range from 1.5 nm to 1.9 nm. In some embodiments of the heterostructures, the shear strain is in the range from 0.1% to 0.4%, including in the range from 0.1% to 0.2%, where the shear strain can be determined by ellipsometry. However, concentrations, periods, and/or shear strains outside of these ranges can be used to achieve a desired level of valley splitting.

The quantum barrier and quantum well layers of the heterostructures can be grown using standard growth techniques, such as chemical vapor deposition (CVD) or molecular beam epitaxy (MBE). The barrier layers are layers of a silicon-germanium alloy (SiGe) or pure germanium. Thus, the quantum barrier layer material can be represented by the formula $Si_xGe_{(1-x)}$, wherein $0 \leq x < 1$. When a graded and relaxed SiGe is used as a barrier layer, a strained silicon quantum well layer can be grown thereon. Graded and relaxed SiGe can be formed on a silicon wafer by growing a barrier layer of $Si_xGe_{(1-x)}$ epitaxially until it terminates in the desired composition. The quantum barrier layers and the quantum well layer are designed to provide quantum confinement of electrons in the well, with typical thicknesses ranging from tens to hundreds of nanometers.

The ability to achieve large valley splitting with long-period Ge concentration oscillations is advantageous because such long-period oscillations are readily achieved using conventional growth techniques, such as pulsed CVD or MBE. In one example of a method of making the Ge-seeded Si layer, a pulsed CVD process is used in which the ratio of Si to Ge is varied between pulses to produce a sinusoidal or quasi-sinusoidal profile. In this process, multiple cycles, each including a series of sequential pulses, are used to grow a layer of Si in which the concentration of Ge oscillates as a function of depth through the layer. In a first pulse of the series, the concentration of Ge in the pulse corresponds to the peak Ge concentration in the profile. This first pulse is, optionally, followed by one or more intermediate pulses in which the concentration of Ge is between zero and the peak Ge concentration. A Ge-free or low-Ge pulse is then used to define the minimum in the oscillating Ge concentration profile, optionally followed by one or more additional intermediate pulses to end the series. CVD growth of a Si quantum well layer having a sinusoidally varying Ge concentration is described in detail in McJunkin, Thomas, et al. "SiGe quantum wells with oscillating Ge concentrations for quantum dot qubits." *Nature Communications* 13.1 (2022): 7777.

Once the heterostructures are formed, one or more electrodes (electrostatic gates) can be used to define one or more quantum dots in the heterostructures, and these one or more quantum dots can act as qubits in a quantum information processing device. In gate-controlled quantum dot systems, the electrostatic gates provide a controllable horizontal potential profile for the confinement of electrons in three dimensions. The movement of electrons in the quantum dots is restricted due to the confining potential, which results in bound states with discrete energy levels. The wavefunctions describing these states may then be utilized to establish the two-level system. Specifically, if the spatial part of an electron wavefunction is used, a charge qubit is achieved, with the spatial wavefunction defining the electron charge distribution. On the other hand, if the spin portion of the wavefunction is used, a spin qubit is produced. By tuning the confinement strength and electrochemical potential using lateral and/or vertical gates, as well as the coupling to other quantum dots or reservoirs, the size and occupation of each quantum dot can be controlled to obtain a wide variety of quantum systems for use in quantum computation.

A number of strategies can be used for designing electrostatic gates for applying electric fields to the heterostructures in order to define quantum dots and to perform qubit transformations in a quantum computing system. Descriptions of suitable gate configurations can be found in the literature, including in the following references: "Measurements of capacitive coupling within a quadruple quantum dot array." S. F. Neyens, E. R. MacQuarrie, J. P. Dodson, J. Corrigan, Nathan Holman, B. Thorgrimsson, M. Palma, T. McJunkin, L. F. Edge, Mark Friesen, S. N. Coppersmith, and M. A. Eriksson, *Phys. Rev. Applied* 12, 064049 (2019); and "A programmable two-qubit quantum processor in silicon." T. F. Watson, S. G. J. Philips, E. Kawakami, D. R. Ward, P. Scarlino, M. Veldhorst, D. E. Savage, M. G. Lagally, Mark Friesen, S. N. Coppersmith, M. A. Eriksson, and L. M. K. Vandersypen, *Nature* 555, 633 (2018).

One example of a quantum computing system includes at least two qubits located in quantum dots based on the heterostructures described herein. In some embodiments, more qubits are included in a quantum dot assembly. The system also includes a controller for controlling the qubits to perform a quantum computation and an output for providing a report generated using information obtained from the quantum computation performed.

Figure 2:
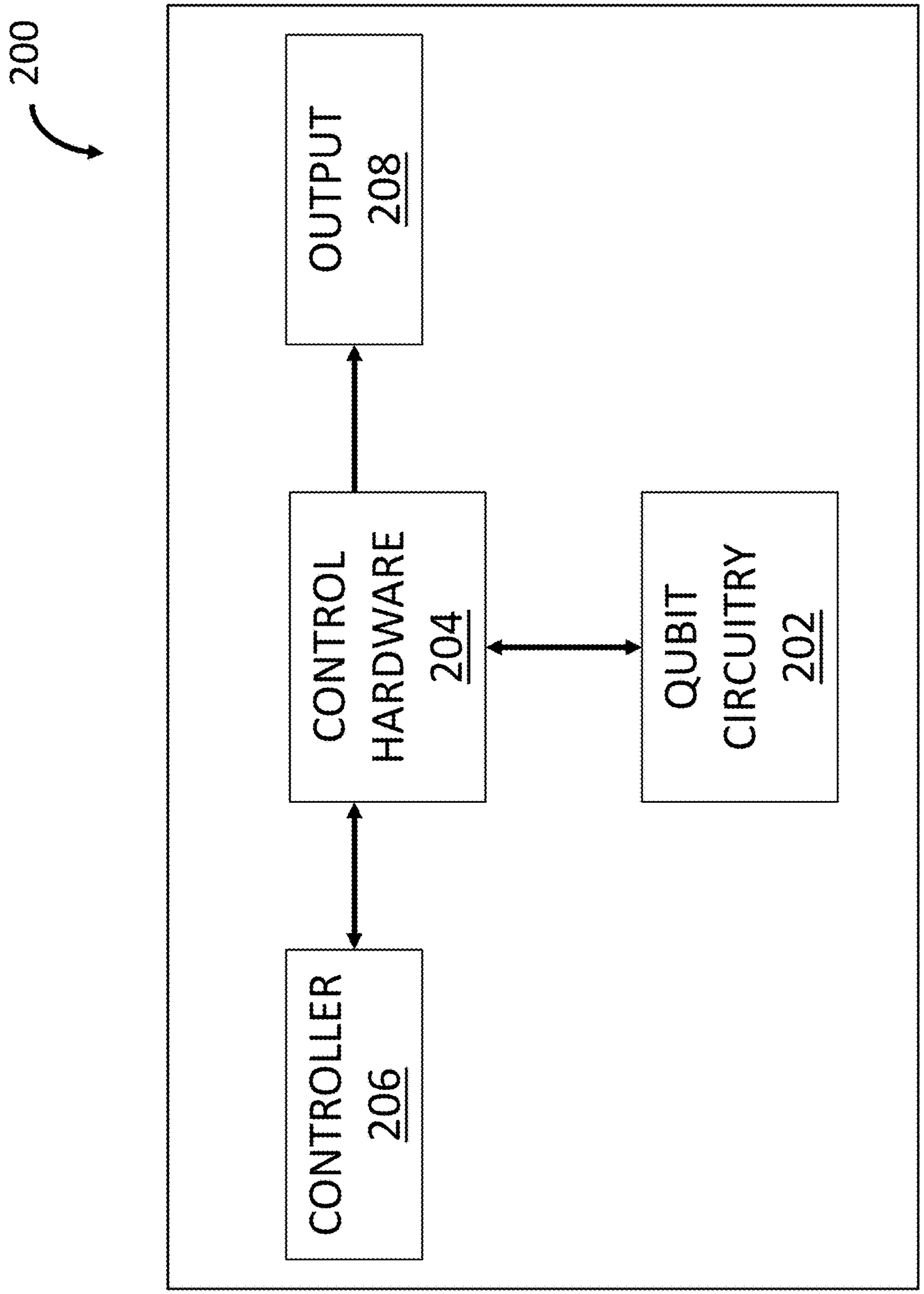
FIG. 2 is a schematic of an example system for use in quantum computation.

Turning now to FIG. 2, an example quantum computing system 200 for quantum computation or quantum information processing is shown. The system 200 can include qubit circuitry 202, control hardware 204 in communication with the qubit circuitry 202, and a controller 206 for directing the control hardware 204 to carry out various qubit manipulations and measurements, along with other operations. The system 200 also includes an output 208 for providing the quantum computation results. In general, the system 200 may be configured to operate over a broad range of conditions, and may include capabilities and hardware for achieving those conditions. For instance, although not shown in FIG. 2, the system 200 may be configured to achieve and sustain ultra-low temperatures, such as temperatures below a few Kelvin, using a refrigeration unit.

The qubit circuitry may be configured to initialize a qubit, perform qubit transformations, and read out the final state of a qubit or qubits. For instance, the qubit circuitry 202 may include one or more metallic gates configured to control charge confinement and states of the quantum dots in a quantum dot assembly. In addition to gates, the qubit circuitry 202 may also include one or more charge sensors coupled to the quantum dot assembly configured for measuring qubit states. Example charge sensors can include tunnel probes, quantum point contacts, single electron transistors, as well as other sensors for sensing charge. In addition, the qubit circuitry 202 may also include one or more sources or drains for measuring charge transport. Furthermore, the qubit circuitry 202 may also include elements for coupling of the quantum dot assembly to external components.

Referring again to FIG. 2, the control hardware 204 can include any number of electronic systems, hardware, or circuitry components capable of a wide range of functionality for controlling the qubit circuitry 202. For instance, the control hardware 204 can include one or more voltage sources, current sources, microwave sources, spectrometers, signal generators, amplifiers, and so forth. Such control hardware 204 may be configured to send, receive, and process a wide array of signals. For example, the control hardware 204 may be configured to generate a number of pulsed voltages, or currents, to achieved pulsed gates for implementing qubit operations.

In general, the control hardware 204, as directed by the controller 206, may be used to prepare the qubit(s) formed by the qubit circuitry 202, as described. For instance, the control hardware 204 may be configured to populate the quantum dot assembly with one or more electrons (or holes). In addition, the control hardware 204 may be configured to form qubit states for the charge qubit using different charge distributions having the same center of mass. In some aspects, the control hardware 204 may prepare and manipulate the qubit(s).

The control hardware 204 may perform a number of quantum logic operations, including the application of ac gates, dc gates, pulsed gates, and combinations thereof. The control hardware 204 can then readout the qubits(s), for instance, using one or more charge sensors, and provide, via the output 208, a report of any form for the quantum computation results obtained.

EXAMPLE

Figures 3A, 3B, 3C:
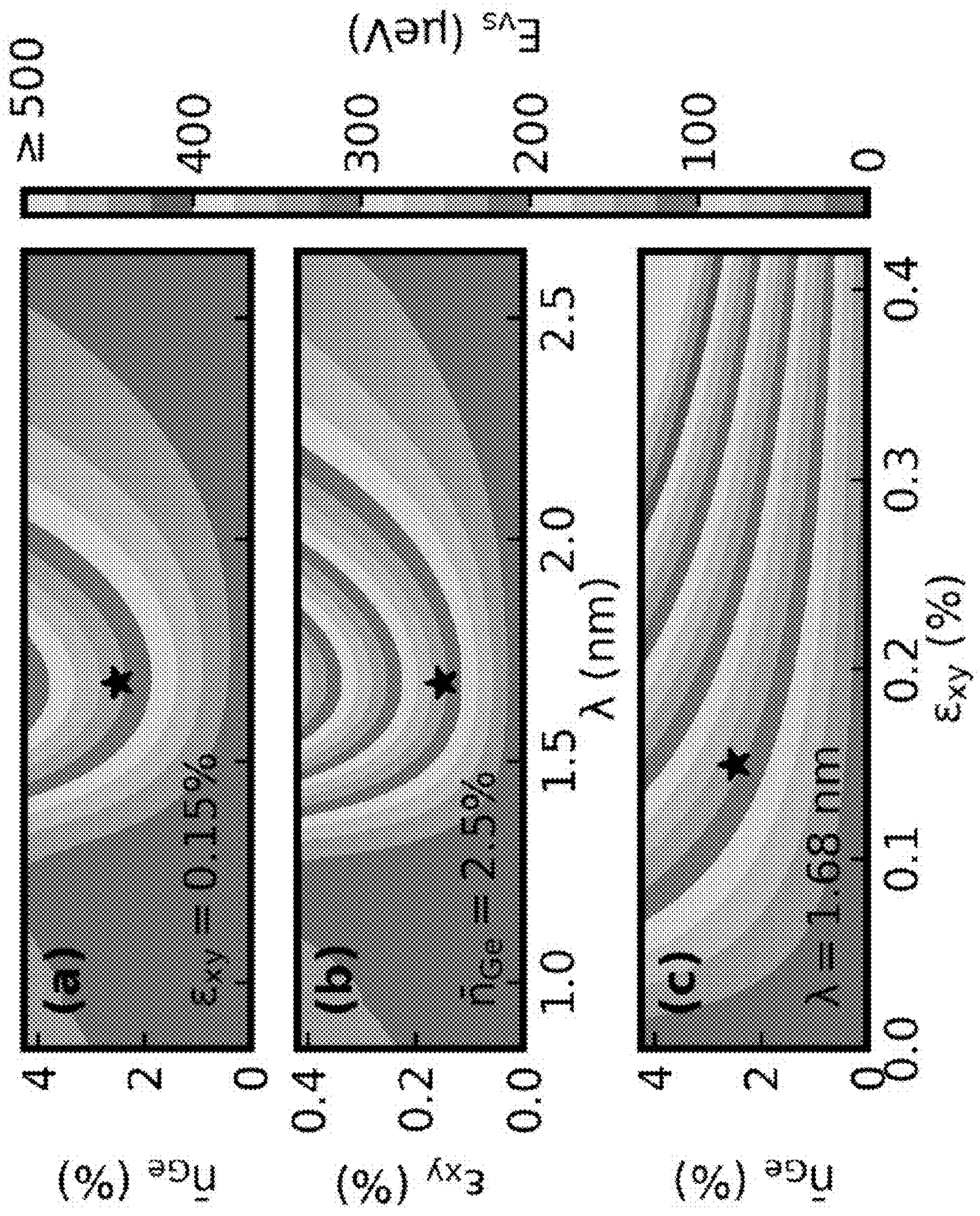
FIGS. 3A-3C show the calculated valley splitting, $E_{VS}$, as a function of shear strain $\varepsilon_{xy}$, Ge concentration oscillation wavelength, λ, and average Ge concentration, $n_{Ge}$ in the quantum well region, where $\varepsilon_{xy}$=0.15%, $n_{Ge}$=2.5 atomic percent (at. %), and λ=1.68 nm were fixed in FIG. 3A, FIG. 3B, and FIG. 3C, respectively. The valley splitting $E_{VS}$ was significantly enhanced by the combination of shear strain $\varepsilon_{xy}$ and Ge oscillations of λ~1.68 nm. The quantum well was immersed in an electric field of $F_z$=2 mV/nm and had a large interface width of w=1.9 nm. System parameters corresponding to the black stars were the same for all panels.
Figures 4A, 4B, 4C, 4D:
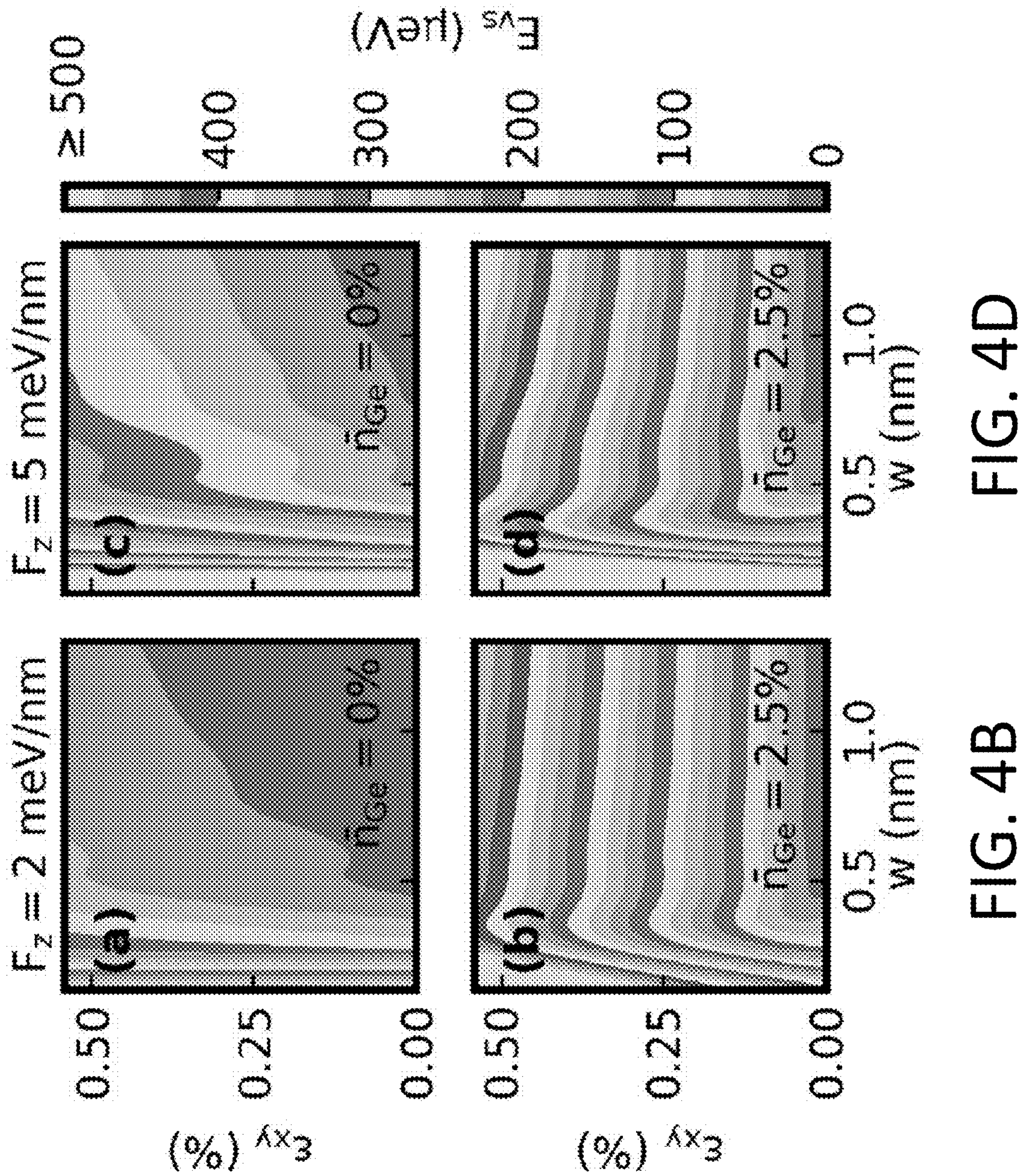
FIGS. 4A-4D show the calculated valley splitting $E_{VS}$ as a function of shear strain $\varepsilon_{xy}$ and interface width w for different average Ge concentrations in the quantum well regions and electric fields $F_z$. The Ge oscillation wavelength was fixed at λ=1.68 nm. The valley splitting clearly increased more rapidly with increasing shear strain in the presence of Ge oscillations (FIGS. 4B and 4D). In the absence of Ge oscillations (FIGS. 4A and 4C), $E_{VS}$ was sensitive to $F_z$ since a relatively sharp interface is still necessary for large valley splitting. In contrast, $E_{VS}$ was largely independent of $F_z$ in the presence of Ge oscillations (FIGS. 4B and 4D), except for small w. This indicates the valley splitting enhancement in the presence of shear strain and Ge oscillations was a bulk effect, rather than being due to a sharp interface.

This example demonstrates that a combination of shear strain $\varepsilon_{xy}$ and long-wavelength, $\lambda \approx 1.7$ nm, sinusoidal Ge concentration oscillations in a SiGe/Ge-Seeded Si/SiGe heterostructure yields an enhanced valley splitting. The valley splitting $E_{VS}$ is calculated as a function of shear strain $\varepsilon_{xy}$, Ge concentration oscillation wavelength $\lambda$, and Ge concentration $\bar{n}_{Ge}$ and the results are shown in FIGS. 3A-3C. The calculations are based on a modified version of the one-dimensional (1D) single-orbital tight-binding model of Boykin, Timothy B., et al. "Valley splitting in strained silicon quantum wells." *Applied Physics Letters* 84.1 (2004): 115-117 and the more sophisticated $sp^3d^5s^*$ tight-binding model described in Niquet, Yann-Michel, et al. "Onsite matrix elements of the tight-binding Hamiltonian of a strained crystal: Application to silicon, germanium, and their alloys." *Physical Review B* 79.24 (2009): 245201 and Jancu. Jean-Marc, et al. "Empirical spds* tight-binding calculation for cubic semiconductors: General method and material parameters." *Physical Review B* 57.11 (1998): 6493.

The heterostructure design for this example corresponds to that shown in FIG. 1A with a large interface width of w=1.9 nm and moderate vertical electric field of $F_z$=2 mV/nm, such that the valley splitting $E_{VS}$<10 μeV in the absence of shear strain and Ge concentration oscillations. Fixing the shear strain $\varepsilon_{xy}$=0.15% in FIG. 3A, an increasing valley splitting $E_{VS}$ was found with increasing Ge concentration $\bar{n}_{Ge}$ near λ=1.7 nm. Importantly, the enhancement occurred over a wide range of Ge wavelengths centered near λ=1.7 nm, demonstrating that the valley-satellite condition of Δk=4π/a does not need to be perfectly satisfied. Fixing the Ge concentration $\bar{n}_{Ge}$=2.5 at. % in FIG. 3B, similar behavior of $E_{VS}$ was found with increasing shear strain $\varepsilon_{xy}$ near λ=1.7 nm. The data of FIGS. 3A and 3B show that $E_{VS}$ has a linear dependence on both $\varepsilon_{xy}$ and $\bar{n}_{Ge}$ near λ=1.7 nm. Finally, FIG. 3C shows $E_{VS}$ as a function of $\varepsilon_{xy}$ and nice for λ=1.68 nm, which was the Ge concentration wavelength for the data in FIGS. 3A and 3B for which the valley splitting grew most quickly. This result clearly shows that it is the combination of Ge oscillations and shear strain that produces the valley splitting enhancement, rather than both properties separately contributing significantly to the enhancement. Indeed, in FIG. 3C along the x and y axes, where $\varepsilon_{xy}$=0 and $\bar{n}_{Ge}$=0, respectively. $E_{VS}$<50 λeV was found for all parameter values.

To further illustrate the benefits of including long wavelength Ge concentration oscillations alongside shear strain in the quantum well, the valley splitting was calculated as a function of shear strain $\varepsilon_{xy}$ and interface width w in FIGS. 4A-4D. Results are shown for two electric field values, $F_z$=2 and 5 mV/nm, in both the absence ($\bar{n}_{Ge}$=0) and presence ($\bar{n}_{Ge}$=2.5%) of Ge oscillations. The Ge oscillation wavelength was fixed at λ=1.68 nm for FIGS. 4B and 4D. As can been seen in FIGS. 4A and 4C, shear strain in the absence of Ge oscillations increased the valley splitting. However, except for small interface width w values, where the first-order coupling of the valley minima by the interface dominated over the second-order process involving the shear strain, it was found by comparing FIGS. 4A and 4C to FIGS. 4B and 4D that the valley splitting increased more rapidly with increasing shear strain in the presence of Ge oscillations. This can be explained by the fact that the system with Ge oscillations had a potential whose Fourier coefficients were concentrated near the wave vector corresponding to λ=1.7 nm. In contrast, the interface potential had a Fourier decomposition that was spread over a wide range of wave vectors, making the second-order process much less pronounced.

FIGS. 4A-4D also illustrate the contrasting impact of the interface on the valley splitting in the absence and presence of Ge oscillations. In the absence of Ge oscillations (FIGS. 4A and 4C), $E_{VS}$ is quite sensitive to both the interface width w and electric field $F_z$. This is because the valley splitting in this case was essentially an interface effect, where the potential Fourier components corresponding to λ≈1.7 nm coming from the interface and electric field produced a residual form of the second-order process when combined with shear strain. In contrast, $E_{VS}$ in the presence of Ge oscillations was largely independent of both $F_z$ and w, except for small w≤0.32 where the first-order process mentioned above dominated. This shows that the valley enhancement from the combination of shear strain and Ge oscillations was fundamentally not an effect from a sharp interface but was rather a bulk property of the quantum well.

The word "illustrative" is used herein to mean serving as an example, instance, or illustration. Any aspect or design described herein as "illustrative" is not necessarily to be construed as preferred or advantageous over other aspects or designs.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A heterostructure comprising:

a first quantum barrier comprising a layer of silicon-germanium alloy or a layer of germanium;

a second quantum barrier comprising a layer of silicon-germanium alloy or a layer of germanium; and a quantum well comprising a layer of shear-strained germanium-seeded silicon disposed between the first quantum barrier and the second quantum barrier, wherein the layer of germanium-seeded silicon has an oscillating germanium concentration along its thickness direction (z) and a shear strain, $\varepsilon_{xy}$, in a plane normal to the thickness direction.

2. The heterostructure of claim 1, wherein the shear-strained germanium-seeded silicon has a valley splitting of at least 100 μeV.

3. The heterostructure of claim 1, wherein the shear-strained germanium-seeded silicon has a valley splitting of at least 200 μeV.

4. The heterostructure of claim 1, wherein the oscillating germanium concentration has a sinusoidal profile.

5. The heterostructure of claim 4, wherein the sinusoidal profile has a wavelength in the range from 1.2 nm to 2.5 nm.

6. The heterostructure of claim 4, wherein the sinusoidal profile has a wavelength in the range from 1.4 nm to 2.3 nm.

7. The heterostructure of claim 5, wherein the average concentration of germanium in the shear-strained germanium-seeded silicon is in the range from 1 atomic percent to 10 atomic percent, the shear strain is in the range from 0.1% to 10%, or both.

8. The heterostructure of claim 1, wherein the shear strain is induced by one or more trenches formed in the heterostructure and aligned along a [110] crystallographic direction or a [1$\bar{1}$0] crystallographic direction of the silicon.

9. The heterostructure of claim 8, wherein the shear strain is localized in a channel formed in the heterostructure between a pair of trenches aligned along a [110] crystallographic direction or a pair of trenches aligned along a [1$\bar{1}$0] crystallographic direction of the silicon.

10. The heterostructure of claim 1, wherein the first quantum barrier and the second quantum barrier comprise the layer of silicon-germanium alloy.

11. A gate-controlled quantum dot comprising:

a heterostructure comprising:

a first quantum barrier comprising a layer of silicon-germanium alloy or a layer of germanium;

a second quantum barrier comprising a layer of silicon-germanium alloy or a layer of germanium; and a quantum well comprising a layer of shear-strained germanium-seeded silicon disposed between the first quantum barrier and the second quantum barrier, wherein the layer of germanium-seeded silicon has an oscillating germanium concentration along its thickness direction (z) and a shear strain, $\varepsilon_{xy}$, in a plane normal to the thickness direction; and one or more electrostatic gates in electrical communication with the heterostructure, wherein the one or more electrostatic gates are configured to apply a controllable potential to the quantum well that confines electrons in the quantum well in three dimensions.

12. The gate-controlled quantum dot of claim 11, wherein the shear-strained germanium-seeded silicon has a valley splitting of at least 100 μeV.

13. The gate-controlled quantum dot of claim 11, wherein the shear-strained germanium-seeded silicon has a valley splitting of at least 200 μeV.

14. The gate-controlled quantum dot of claim 11, wherein the oscillating germanium concentration has a sinusoidal profile.

15. The gate-controlled quantum dot of claim 14, wherein the sinusoidal profile has a wavelength in the range from 1.2 nm to 2.5 nm.

16. A quantum computing system for performing quantum computation, the system comprising:

a heterostructure comprising:

a first quantum barrier comprising a layer of silicon-germanium alloy or a layer of germanium;

a second quantum barrier comprising a layer of silicon-germanium alloy or a layer of germanium; and a quantum well comprising a layer of shear-strained germanium-seeded silicon disposed between the first quantum barrier and the second quantum barrier, wherein the layer of germanium-seeded silicon has an oscillating germanium concentration along its thickness direction (z) and a shear strain, $\varepsilon_{xy}$, in a plane normal to the thickness direction;

one or more electrostatic gates in electrical communication with the heterostructure, the one or more electrostatic gates being configured to apply controllable potentials to the quantum well, wherein the controllable potentials define one or more gate-controlled qubits in the heterostructure;

a controller for controlling the potentials applied by the one or more electrostatic gates; and a sensor for reading out a state of the one or more gate-controlled qubits.

17. The quantum computing system of claim 16, wherein the shear-strained germanium-seeded silicon has a valley splitting of at least 100 μeV.

18. The quantum computing system of claim 16, wherein the shear-strained germanium-seeded silicon has a valley splitting of at least 200 μeV.

19. The quantum computing system of claim 16, wherein the oscillating germanium concentration has a sinusoidal profile.

20. The quantum computing system of claim 19, wherein the sinusoidal profile has a wavelength in the range from 1.2 nm to 2.5 nm.

* * * * *